(12) United States Patent
Anderson et al.

(10) Patent No.: US 8,159,008 B2
(45) Date of Patent: Apr. 17, 2012

(54) METHOD OF FABRICATING A TRENCH-GENERATED TRANSISTOR STRUCTURE

(75) Inventors: Brent A. Anderson, Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 194 days.

(21) Appl. No.: 12/562,419

(22) Filed: Sep. 18, 2009

(65) Prior Publication Data

US 2011/0068398 A1    Mar. 24, 2011

(51) Int. Cl.
*H01L 21/74* (2006.01)
(52) U.S. Cl. ......... 257/285; 257/220; 257/283; 438/149
(58) Field of Classification Search .................. 257/220, 257/285; 438/149
See application file for complete search history.

(56) References Cited

U.S. PATENT DOCUMENTS

| | | | |
|---|---|---|---|
| 4,649,627 A | 3/1987 | Abernathey et al. | |
| 4,994,406 A | 2/1991 | Vasquez et al. | |
| 5,108,783 A * | 4/1992 | Tanigawa et al. | 438/359 |
| 5,443,661 A | 8/1995 | Oguro et al. | |
| 5,889,293 A | 3/1999 | Rutten et al. | |
| 5,923,067 A | 7/1999 | Voldman | |
| 5,930,107 A | 7/1999 | Rajeevakumar | |
| 6,051,874 A | 4/2000 | Masuda | |
| 6,103,564 A | 8/2000 | Masuda | |
| 6,140,673 A * | 10/2000 | Kohyama | 257/301 |
| 6,232,202 B1 | 5/2001 | Hong | |
| 6,297,127 B1 | 10/2001 | Chen et al. | |
| 6,303,413 B1 | 10/2001 | Kalnitsky et al. | |
| 6,303,414 B1 | 10/2001 | Ang et al. | |
| 6,465,852 B1 | 10/2002 | Ju | |
| 6,667,226 B2 | 12/2003 | Pinto et al. | |
| 6,670,677 B2 | 12/2003 | Choe et al. | |
| 6,826,025 B2 | 11/2004 | Singh et al. | |
| 6,833,602 B1 | 12/2004 | Mehta | |
| 6,864,151 B2 | 3/2005 | Yan et al. | |
| 6,885,080 B2 | 4/2005 | Chen et al. | |
| 7,009,237 B2 | 3/2006 | Adkisson et al. | |
| 7,019,348 B2 | 3/2006 | Tu | |
| 7,242,071 B1 | 7/2007 | Liu et al. | |
| 7,282,771 B2 | 10/2007 | Voldman | |
| 2005/0106836 A1 | 5/2005 | Chen et al. | |
| 2007/0178639 A1 | 8/2007 | Cecchi et al. | |
| 2007/0287243 A1 | 12/2007 | Liu et al. | |

(Continued)

OTHER PUBLICATIONS

Abadeer, et al, U.S. Appl. No. 12/108,924, filed Apr. 24, 2008.

(Continued)

*Primary Examiner* — Marcos D. Pizarro
*Assistant Examiner* — Tifney Skyles
(74) *Attorney, Agent, or Firm* — Wood, Herron & Evans, LLP

(57) ABSTRACT

Trench-generated transistor structures, methods for fabricating transistors using a trench defined in a semiconductor-on-insulator (SOI) wafer, design structures for a trench-generated transistor, and other trench-generated device structures. The source and drain of the transistor are defined by doped regions in the semiconductor material of the handle substrate of the SOI wafer. The gate electrode may be defined from the semiconductor layer of the SOI wafer, which is separated from the handle wafer by an insulating layer. Alternatively, the gate electrode may be defined as a conventional gate stack on a shallow trench isolation region in the semiconductor layer or as a conventional gate stack in one of the BEOL interconnect levels.

11 Claims, 12 Drawing Sheets

U.S. PATENT DOCUMENTS

2008/0036029 A1    2/2008  Liu et al.

OTHER PUBLICATIONS

Abadeer, et al., U.S. Appl. No. 12/108,851, filed Apr. 24, 2008.

USPTO, Notice of Allowance issued in related U.S. Appl. No. 12/111,266, dated Sep. 30, 2009.

USPTO, Notice of Allowance issued in related U.S. Appl. No. 12/111,285, dated Oct. 6, 2009.

* cited by examiner

METHOD OF FABRICATING A TRENCH-GENERATED TRANSISTOR STRUCTURE

BACKGROUND

The invention relates generally to semiconductor device fabrication and, in particular, to transistors, device structures incorporating transistors, methods of fabricating transistors, and design structures for a transistor.

Integrated circuits may include multiple field effect transistors fabricated using a bulk wafer of semiconductor material or the device layer of a semiconductor-on-insulator (SOI) wafer. Field effect transistors of planar device architecture have source region and drain regions defined in the semiconductor material of the bulk wafer of the device layer of the SOI wafer. The source and drain regions are separated by a channel region of opposite conductivity type. Charge carriers flow across the channel region under control of a voltage applied to a gate electrode. Complementary Metal Oxide Semiconductor (CMOS) technology, which is the prevailing technology used in integrated circuit fabrication, integrates two distinct varieties of field effect transistors known as "n-channel" and "p-channel". Electron transport is responsible for carrier flow and output current in n-channel MOS field effect transistors. Hole transport is responsible for carrier flow and output current in p-channel MOS field effect transistors.

Improved transistor device structures, improved methods for fabricating transistors, and improved transistor design structures are needed.

BRIEF SUMMARY

In an embodiment of the invention, a method is provided for fabricating a device structure using a layer stack that includes a semiconductor layer, a handle substrate, and an insulating layer between the semiconductor layer and the handle substrate. The method includes forming first and second trenches each extending from a top surface of the semiconductor layer through the semiconductor layer and the insulating layer into the handle substrate. The first and second trenches are at least partially filled with a doped material containing a dopant having a second conductivity type in the semiconductor material that is opposite to a first conductivity type of the semiconductor material of the handle substrate. A concentration of the dopant is transported outwardly from the doped material into the semiconductor material of the handle substrate surrounding the first trench to define a first doped region of the second conductivity type and into the semiconductor material of the handle substrate surrounding the second trench to define a second doped region of the second conductivity type. The method further includes forming a gate electrode aligned with a channel region defined in the semiconductor material of the handle substrate between the first and second doped regions.

In an embodiment of the invention, a device structure is fabricated using a layer stack having a semiconductor layer, a handle substrate, and an insulating layer between the semiconductor layer and the semiconductor substrate. The device structure includes a first trench and a second trench each extending from a top surface of the semiconductor layer through the semiconductor layer and the insulating layer into the handle substrate, and first and second doped regions in the semiconductor material of the handle substrate. The first doped region extends about the first trench and the second doped region extends about the second trench. The first and second doped regions each have a second conductivity type opposite to the first conductivity type of the semiconductor material of the handle substrate. The device structure further includes a channel region defined in the semiconductor material of the handle substrate between the first and second doped regions, and a gate electrode aligned with the channel region.

In another embodiment, the device structure is included in a design structure, which is embodied in a machine readable storage medium for designing, manufacturing, or testing an integrated circuit. The design structure may comprise a netlist. The design structure may also reside on storage medium as a data format used for the exchange of layout data of integrated circuits. The design structure may reside in a programmable gate array.

In yet another embodiment, a device structure is fabricated using a layer stack having a silicon layer, a handle substrate, and an insulating layer between the silicon layer and the semiconductor substrate. The device structure includes first and second transistors each having a source region in the semiconductor material of the handle substrate, a drain region in the semiconductor material of the handle substrate, and a channel region in the semiconductor material of the handle substrate between the source region and the drain region. The device structure further comprises a first gate electrode composed of a first portion of the silicon layer and a second gate electrode composed of a second portion of the silicon layer. The first gate electrode contains a majority dopant of a first conductivity type and is aligned with the channel region of the first transistor. The second gate electrode contains a majority dopant of a second conductivity type opposite to the first conductivity type and is aligned with the channel region of the second transistor.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
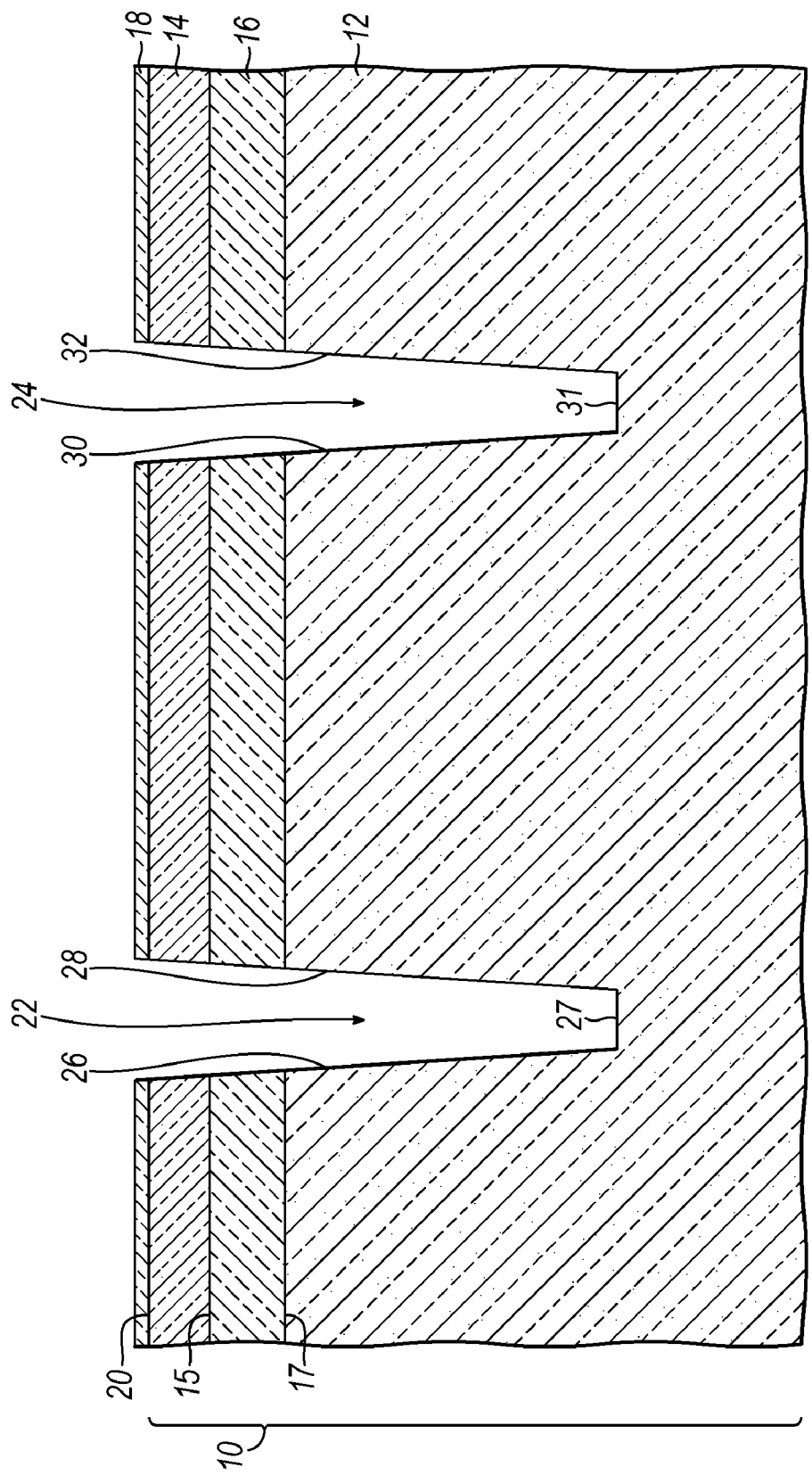
FIGS. 1-5 are diagrammatic cross-sectional views of a portion of a substrate at successive fabrication stages of a processing method for fabricating a device structure in accordance with an embodiment of the invention.

With reference to FIG. 1 and in accordance with an embodiment of the invention, a semiconductor-on-insulator (SOI) wafer 10 includes a handle substrate 12, an active semiconductor or SOI layer 14, and a buried insulating layer 16 formed of a dielectric material. The buried insulating layer 16 may be a buried oxide layer composed of silicon dioxide (e.g., $SiO_2$). The SOI layer 14 is separated from the handle substrate 12 by the intervening buried insulating layer 16. The SOI layer 14 is composed of single crystal or monocrystalline semiconductor material, such as silicon or another material that is primarily composed of silicon. The monocrystalline semiconductor material of the SOI layer 14 may contain a definite defect concentration and still be considered to be single crystal. The handle substrate 12 may also be constituted by a single crystal or monocrystalline semiconductor material, such as silicon, or another type of material that is primarily composed of silicon. In one embodiment, the handle substrate 12 may be lightly doped with a concentration of a p-type dopant, such as $5 \times 10^{15}$ cm$^{-3}$ of boron. The buried insulating layer 16 electrically isolates the handle substrate 12 from the SOI layer 14, which is considerably thinner than the handle substrate 12 and is in direct contact with a top surface 15 of the buried insulating layer 16. After device structures are fabricated in product chips using the SOI wafer 10, a dicing operation is applied to produce multiple die, each carrying a completed replica of an integrated circuit.

A hardmask layer 18 is disposed on a top surface 20 of the SOI layer 14 across the SOI wafer 10. The material constituting the hardmask layer 18 is selected to etch selectively to the semiconductor material constituting the SOI layer 14 and to be readily removed at a subsequent fabrication stage. In one embodiment, hardmask layer 18 may be composed of $SiO_2$ deposited by a chemical vapor deposition (CVD) process or $SiO_2$ grown by oxidizing the SOI layer 14. Alternatively, the hardmask layer 18 may be composed of a different type of material, such as silicon oxynitride ($SiO_xN_y$), or a layered combination of materials, such as a layer of silicon nitride ($Si_3N_4$) and a thinner layer of $SiO_2$ between the $Si_3N_4$ layer and the top surface 20 of the SOI layer 14. The material contained in the hardmask layer 18 may be formed by a wet or dry thermal oxidation process, a CVD process, or a combination of these processes.

Deep trenches, of which deep trenches 22, 24 are representative, are formed by a conventional lithography and etching process at locations distributed across the surface of SOI wafer 10. Specifically, the hardmask layer 18 is patterned using a conventional lithography and etching process. The lithography process applies a resist layer (not shown) on hardmask layer 18, exposes the resist layer to a pattern of radiation through a photomask, and develops the transferred deep trench pattern in the exposed resist to pattern resist layer. The deep trench pattern is transferred to the hardmask layer 18 using the patterned resist layer as an etch mask for an anisotropic dry etching process, such as a reactive-ion etching (RIE) process or a plasma etching process. The etching process removes portions of the hardmask layer 18 exposed through the deep trench pattern in the patterned resist and stops vertically on the top surface 20 of the SOI layer 14. After etching concludes, the resist layer is stripped by, for example, plasma ashing or a chemical stripper.

The deep trench pattern is then transferred by an etching process from the patterned hardmask layer 18 through the SOI layer 14 and the buried insulating layer 16, and into the handle substrate 12 with an anisotropic dry etching process that may be constituted by, for example, a RIE or a plasma etching process. The etching process may be conducted in a single etching step or multiple etching steps with different etch chemistries. For example, an etch chemistry capable of removing the constituent semiconductor material selective to (i.e., with a significantly greater etch rate than) the material(s) constituting the hardmask layer 18 is employed to extend the pattern through the SOI layer 14. A different etch chemistry is then used to etch through the buried insulating layer 16, and then the initial etch chemistry is restored to etch into the handle substrate 12 and extend the deep trenches 22, 24 to a depth greater than a bottom surface 17 of the buried insulating layer 16. The depth of the deep trenches 22, 24 is determined by the desired device specifications. The depth of the deep trenches 22, 24 may be, for example, on the order of 5 microns and the spacing between adjacent deep trenches 22, 24 may be comparable to the trench depth.

Each of the deep trenches 22, 24 defines a trough or window extending completely through the thickness of SOI layer 14 and buried insulating layer 16. Deep trench 22 includes opposite sidewalls 26, 28 that extend through SOI layer 14 and the buried insulating layer 16 and that penetrate into the handle substrate 12 to a base or bottom wall 27. Sidewalls 26, 28 are oriented substantially perpendicular to the top surface 20 of SOI layer 14. Additional sidewalls (not shown) connect sidewalls 26, 28. Similarly, deep trench 24 includes opposite sidewalls 30, 32 that are similar to sidewalls 26, 28 and a base or bottom wall 31 similar to bottom wall 27.

Figure 2:
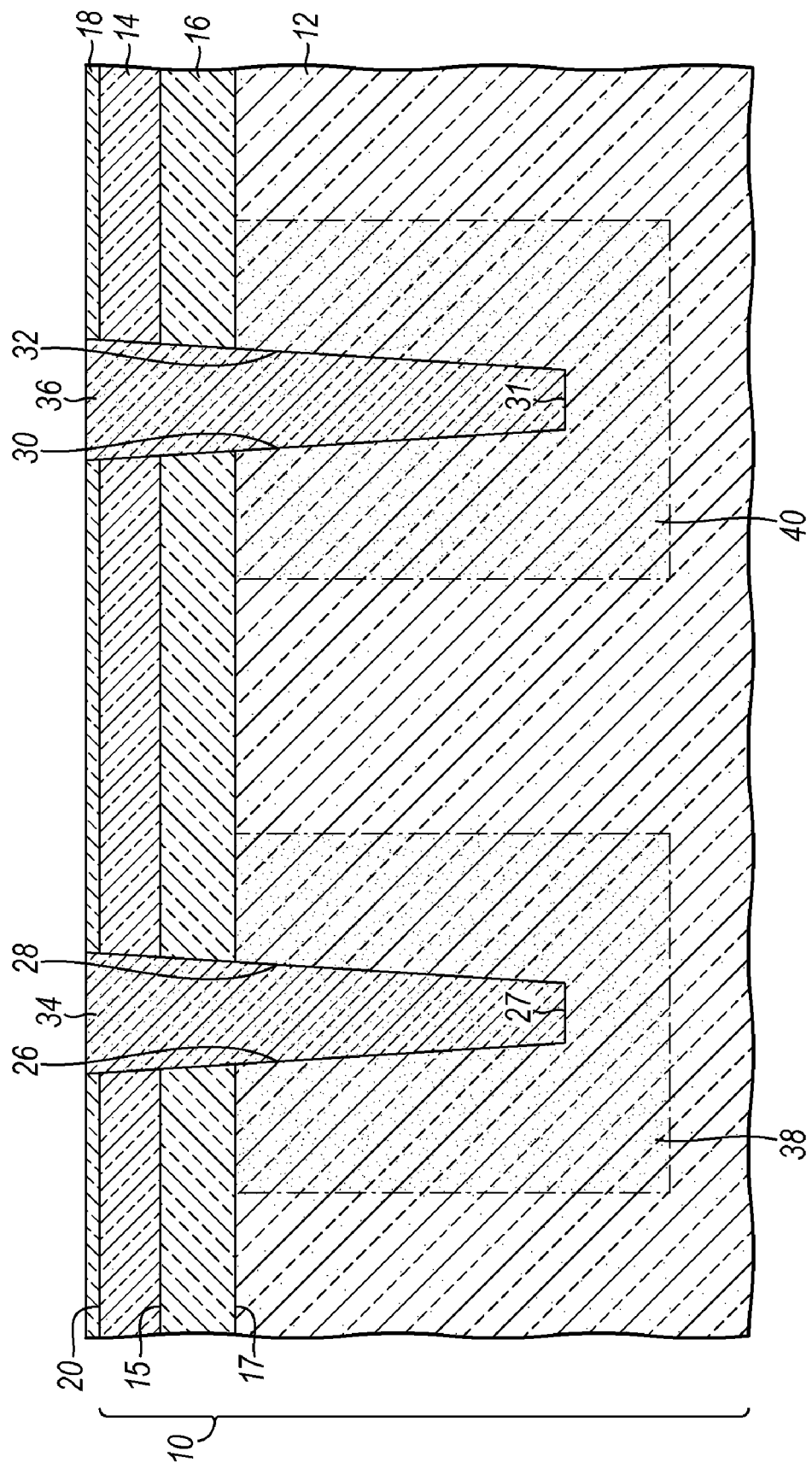

With reference to FIG. 2 in which like reference numerals refer to like features in FIG. 1 and at a subsequent fabrication stage, the deep trenches 22, 24 are filled with respective sacrificial plugs 34, 36 composed of a material that contains a concentration of either a p-type dopant or an n-type dopant and that is readily removed from the deep trenches 22, 24. The doped material forming the sacrificial plugs 34, 36 may be deposited by a CVD process or another conventional deposition technique. Extraneous doped material is removed from the top surface 20 of the SOI layer 14 by a planarization process, such as a chemical mechanical polishing (CMP) process.

Sacrificial plug 34 is in direct contact with the sidewalls 26, 28 and bottom wall 27 of the deep trench 22 and sacrificial plug 36 is in direct contact with the sidewalls 30, 32 and bottom wall 31 of the deep trench 24. A relatively high concentration of dopant originating from each of the sacrificial plugs 34, 36 is transported outwardly from the doped material of each of the sacrificial plugs 34, 36 into the semiconductor material of the handle substrate 12. In one embodiment, the outward transport is promoted by solid phase diffusion or drive-in process that includes a thermal anneal at an elevated temperature (e.g., 800° C. or higher). Diffusion mechanisms in the direction of concentration gradient from the sacrificial plugs 34, 36 into the semiconductor material of the handle substrate 12 and suitable anneal temperatures for this process are understood by a person having ordinary skill in the art.

Doped regions 38, 40 that contain a relatively high impurity concentration of the dopant are defined in the semiconductor material of the handle substrate 12 by the outward dopant diffusion, which is typically isotropic. Doped region 38 extends about and circumscribes the sidewalls 26, 28 of the deep trench 22 and extends below the bottom wall 27 of the deep trench 22. Similarly, doped region 40 extends about and circumscribes the sidewalls 30, 32 of the deep trench 22 and extends below the bottom wall 31 of the deep trench 22. The conductivity type of the outwardly diffused dopant contained in the doped regions 38, 40, which is the majority dopant in doped regions 38, 40, is opposite to the conductivity type of the dopant initially contained in the handle substrate 12.

The sacrificial plugs 34, 36 may be composed of an n-type doped glass, such as arsenic-doped silicate glass (ASG) deposited by a CVD process. In other embodiments in which the resultant device structure is n-channel, the semiconductor material of the doped regions 38, 40 may be heavily doped with a concentration of another dopant (e.g., an impurities species like antimony or phosphorus from Group V of the Periodic Table) effective to impart an n-type conductivity in which electrons are the majority carriers and dominate the electrical conductivity of the semiconductor material. In this embodiment and as described previously, the semiconductor material of the handle substrate 12 is initially lightly doped with a p-type dopant, such as boron, so that the constituent semiconductor material has p-type conductivity opposite to the n-conductivity type of the material in the sacrificial plugs 34, 36.

In an alternative embodiment of the invention, the sacrificial plugs 34, 36 may be composed of a p-type doped glass, such as a boron-doped silicate glass (BSG) deposited by a CVD process. In another embodiment in which the resulting device structure is p-channel, the semiconductor material of the doped regions 38, 40 may be doped with another dopant (e.g., an impurity species like boron or indium from Group III of the Periodic Table) effective to impart a p-type conductivity in which holes are the majority carriers and dominate the electrical conductivity of the semiconductor material. In this particular embodiment, the semiconductor material of the handle substrate 12 is initially doped with an n-type dopant so that the constituent semiconductor material has n-type conductivity opposite to the p-conductivity type of the material in the sacrificial plugs 34, 36.

In an alternative embodiment, the sacrificial plugs 34, 36 may be wet etched back to a depth below to a top surface 15 of the buried insulating layer 16 so that the SOI layer 14 is substantially uncoated by the doped material. In another alternative embodiment, the doped material in the sacrificial plugs 34, 36 may be deposited using, for example, a directional process, such as a high density plasma chemical vapor deposition (HDPCVD) process, that anisotropically deposits a thicker film on planar surfaces than on vertical surfaces. The directional deposition process may be halted before the deposited material level reaches the height of the SOI layer 14. Any extraneous doped material that deposits on the sidewalls 26, 28 of the portion of the deep trench 22 within the SOI layer 14 and the sidewalls 30, 32 of the portion of the deep trench 24 within the SOI layer 14 may be removed by a wet etch process such as buffered hydrofluoric (BHF), or by an isotropic dry etch process such as chemical dry etch (CDE) or chemical oxide removal (COR).

Figure 3:
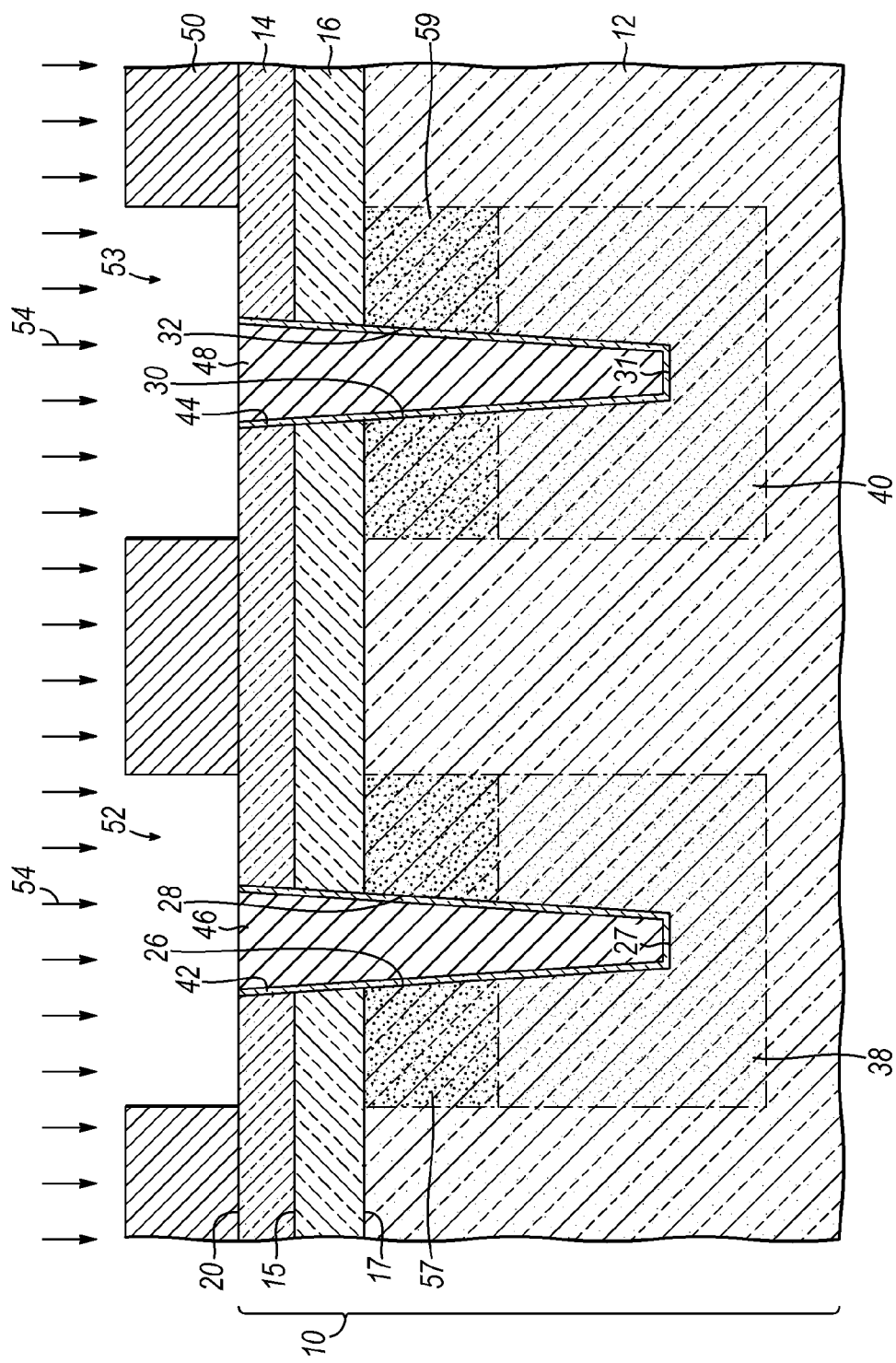

With reference to FIG. 3 in which like reference numerals refer to like features in FIG. 2 and at a subsequent fabrication stage, the sacrificial plugs 34, 36 are removed from the deep trenches 22, 24 after the solid phase diffusion process is completed. In one embodiment, the doped material of the sacrificial plugs 34, 36 may be removed by stripping using a wet etchant solution, such as a solution of buffered hydrofluoric acid. Any remaining hardmask layer 18 is then removed utilizing a conventional reactive ion etch (RIE) or wet chemical stripping process, such as exposure to a solution containing a mixture of hydrofluoric and sulfuric acids.

The deep trench 22 is filled with an insulating liner 42 and a conductive stud 46 after sacrificial plug 34 is removed. Similarly, the deep trench 24 is filled with an insulating liner 44 and a conductive stud 48 after sacrificial plug 36 is removed. The insulating liners 42, 44 separate the conductive studs 46, 48 from the handle substrate 12, the SOI layer 14, and the buried insulating layer 16.

The insulating liners 42, 44 are respectively applied to the sidewalls 26, 28 and bottom wall 27 of the deep trench 22 and the sidewalls 30, 32 and bottom wall 31 of the deep trench 24. The insulating liners 42, 44 may be composed of any suitable dielectric material or combination of dielectric materials deposited in a conventional manner. In various embodiments, the insulating liners 42, 44 may be composed of silicon oxynitride (SiON) or a bilayer of $SiO_2$ and $Si_3N_4$, The insulating liners 42, 44 may also be composed of a high dielectric constant material like aluminum oxide ($Al_2O_3$), zirconium oxide ($ZrO_2$), tantalum pentoxide ($Ta_2O_5$), a hafnium-based material like hafnium oxide ($HfO_2$), a hafnium silicate ($HfSiO_4$), or hafnium oxynitride (HfSiON), and layered stacks of these materials and other similar materials. These types of electrical insulators may be deposited by atomic layer deposition (ALD), a CVD process, or another conventional deposition technology.

Conductive studs 46, 48 may be composed of a conductive material, such as doped polycrystalline silicon (polysilicon) or a metal such as titanium nitride (TiN), and may be formed in the deep trenches 22, 24 by a conventional deposition technique, such as a CVD process or a physical vapor deposition (PVD) process. Conductive studs 46, 48 composed of polysilicon may be doped to have the same conductivity type as the doped regions 38, 40. As an example, the conductive material in conductive studs 46, 48 may be doped in situ during the deposition process with an n-type dopant if the doped regions 38, 40 are likewise doped with an n-type dopant.

Extraneous dielectric material and conductive material from the deposition processes on the top surface 20 of the SOI layer 14 is removed by a planarization process, such as a CMP process. At the conclusion of the planarization, the top surface of the conductive studs 46, 48 is co-planar with the top surface 20 of the SOI layer 14.

The doped regions 38, 40 are further doped by ion implantation with an additional concentration of the existent dopant from the out-diffusion fabrication stage. For example, if the doped regions 38, 40 contain an n-type dopant, the ion implantation process introduces an n-type dopant and, preferably, an n-type dopant consisting of the same impurity species. An implantation mask 50 is applied to the top surface 20 of the SOI layer 14 and the top surface of the conductive studs 46, 48 and patterned to define windows 52, 53 aligned with the doped regions 38, 40 in handle substrate 12. The windows 52, 53 expose a surface area of the SOI layer 14 approximately equal to the vertically-projected surface area of the doped regions 38, 40. The implantation mask 50 masks regions of the handle substrate 12 laterally outside of doped regions 38, 40 with a layer thickness sufficient to stop substantially all of the implanted ions within the mask 50. As a result, only the doped regions 38, 40 receive a dose of the implanted ions.

The implantation mask 50 composed of a radiation-sensitive organic material (e.g., resist) is applied by spin coating, pre-baked, exposed to radiation to impart a latent image of a pattern containing windows 52, 53, baked, and then developed with a chemical developer. The chemical developer removes nonpolymerized material to transform the latent image of windows 52, 53 in the implantation mask 50 into a final image pattern. Each of the windows 52, 53 defines an unmasked region on the SOI layer 14. Procedures for applying and lithographically patterning the implantation mask 50 using a photomask and lithography tool are known to a person having ordinary skill in the art. Following implantation, the implantation mask 50 is removed by ashing or solvent stripping.

The ion implantation process generates energetic ions from a source gas and directs those ions as indicated diagrammatically by singled-headed arrows 54, toward the SOI wafer 10. In regions unmasked by the windows 52, 53 of implantation mask 50, the stopped ions 54 in the handle substrate 12 introduce a concentration profile of a dopant into the doped regions 38, 40 of handle substrate 12. The concentration profile of the stopped ions 54, which is distributed in depth about a projected range, is indicated diagrammatically by regions 57, 59 in FIG. 3. The ions 54 may be implanted with the SOI wafer 10 held at ambient or room temperature, although the present invention is not so limited. The source gas from which the ions 54 are generated contains an n-type dopant species selected from As, phosphorus (P), antimony (Sb), or a combination of these dopants. Preferably, the ion source gas contains only As such that the implanted ions are positive ions of As. The implanted ions 54 may be introduced at a dose appropriate to supply a peak atomic concentration in the handle substrate 12 ranging from about $5 \times 10^{17}$ cm$^{-3}$ to about $1 \times 10^{21}$ cm$^{-3}$. The kinetic energy of the ions 54 is selected such that the projected range of the ions 54 is within the handle substrate 12 so that most ions 54 stop within the doped regions 38, 40. The kinetic energy is also selected in conjunction with the layer thickness of the implantation mask 50 so that the ions 54 do not penetrate through the implantation mask 50.

Alternatively, if the doped regions 38, 40 contain a p-type dopant and the handle substrate 12 is doped to have p-type conductivity, the source gas used to generate the ions 54 may contain a p-type dopant species selected from B, gallium (Ga), aluminum (Al), indium (In), or a combination of these dopants. Preferably, the ion source gas contains only B such that the implanted ions are positive ions of B or positive molecular ions containing B.

Figure 4:
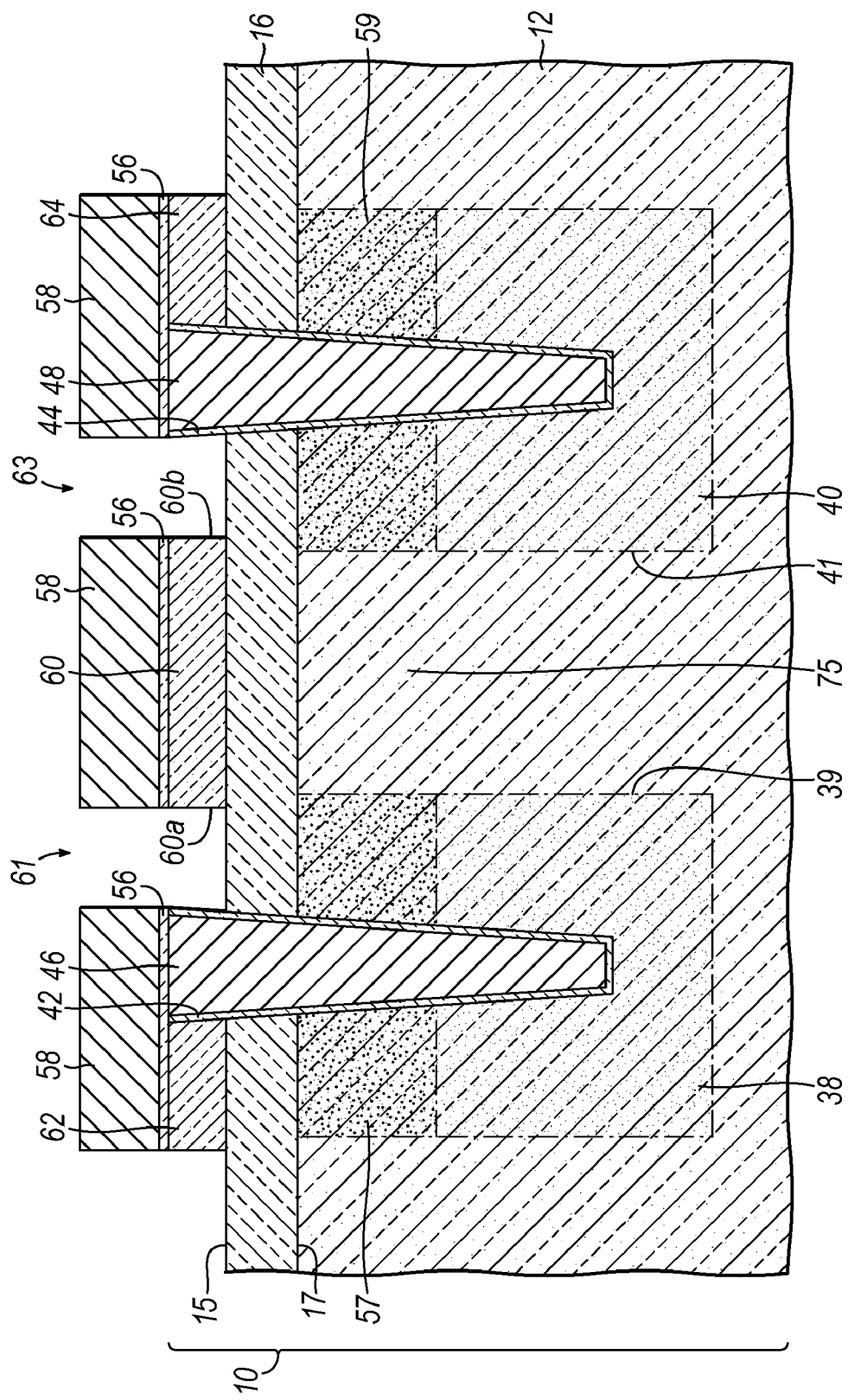

With reference to FIG. 4 in which like reference numerals refer to like features in FIG. 3 and at a subsequent fabrication stage, the SOI layer 14 is patterned using a standard photolithography and subtractive etching process. A hardmask layer 56 composed of a material that etches selectively to the material of the SOI layer 14 is applied to the top surface 20 of the SOI layer 14 and a resist layer 58 composed of a radiation-sensitive organic material is applied on the hardmask layer by spin coating. The resist layer 58 is pre-baked, exposed to radiation to impart a latent image pattern, baked, and then developed with a chemical developer to define residual areas of resist that mask portions of the hardmask layer 56. Procedures for applying and lithographically patterning the resist layer 58 using a photomask and lithography tool are known to a person having ordinary skill in the art. The image pattern is transferred from the resist layer 58 to the hardmask layer 56 by an anisotropic dry etch process, such as a reactive-ion etching (RIE) process.

After the resist layer 58 is removed by ashing or solvent stripping, the image pattern is subsequently transferred from the patterned hardmask layer 56 to the SOI layer 14 using another anisotropic dry etch process and the patterned hardmask layer 56 as a physical etch mask. The hardmask layer 56 covers selected surface areas on the top surface 20 of the SOI layer 14 and masks selected surface areas of the SOI layer 14. Across unmasked surface areas from which the hardmask layer 56 is absent, the material of the SOI layer 14 is removed by etching that stops on the buried insulating layer 16.

A gate electrode 60 and contact regions 62, 64 are defined, following etching, as residual regions of the SOI layer 14 underlying the masked surface areas of SOI layer 14. A gap 61 is defined between contact region 62 and gate electrode 60. A gap 63 is defined between contact region 64 and gate electrode 60. The gaps 61, 63 expose the top surface 15 of the buried insulating layer 16. The gate electrode 60 has sidewalls 60a, 60b that face the gaps 61, 63. In the representative embodiment, sidewall 60a is approximately registered or aligned with the perimeter 39 of the doped region 38 and sidewall 60b is approximately registered or aligned with the perimeter 41 of the doped region 40. The registration of sidewalls 60a, 60b with the perimeters 39, 41 may vary so long as the gate electrode 60 is aligned or registered with a channel region 75 in the semiconductor material of the handle substrate 12 in a manner that permits a control voltage to regulate the charge carrier current in the channel region 75. After the SOI layer 14 is patterned, the hardmask layer 56 is removed utilizing a conventional wet chemical stripping process, such as exposure to a solution containing a mixture of hydrofluoric and sulfuric acids.

Figure 5:
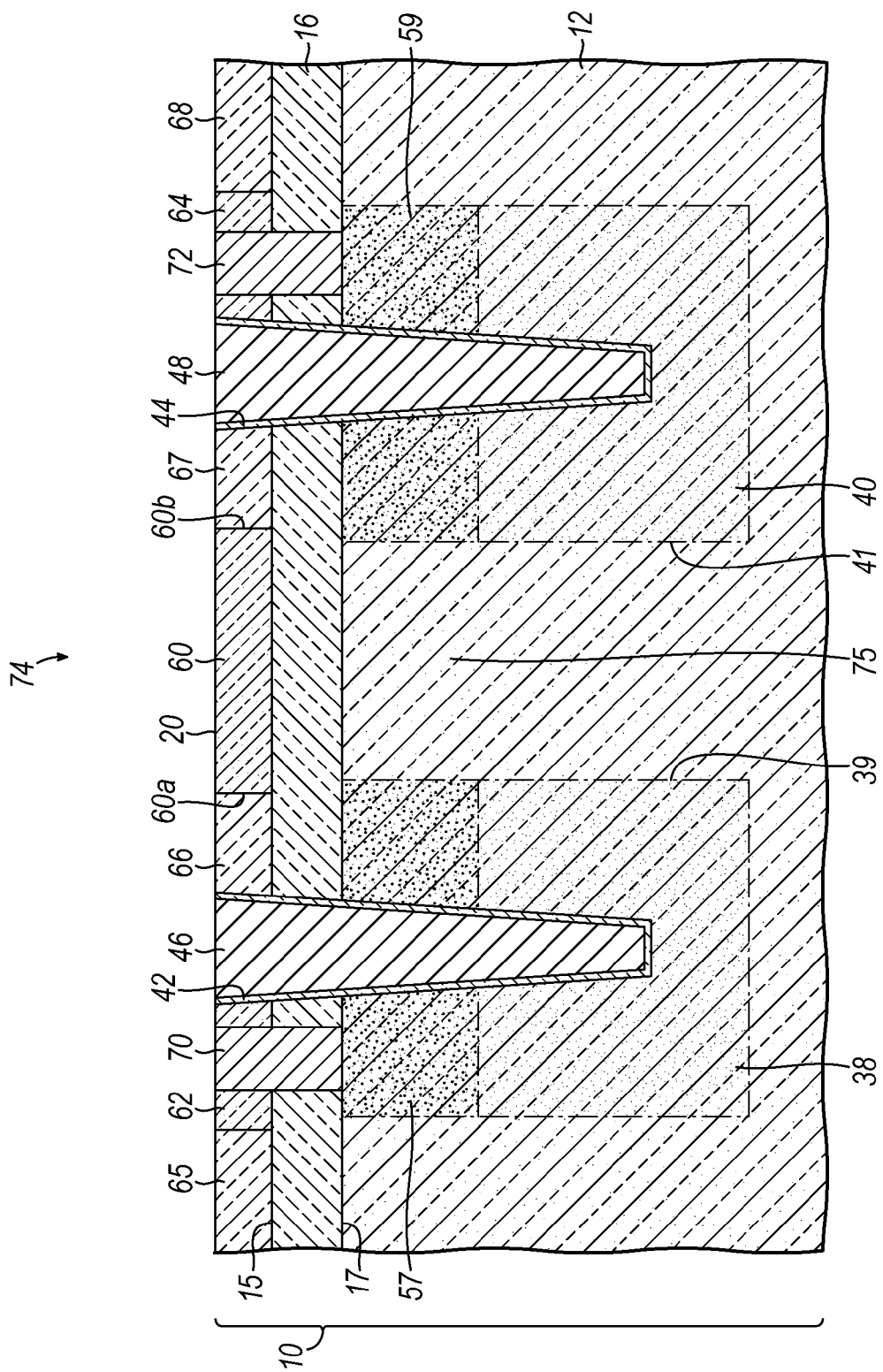

With reference to FIG. 5 in which like reference numerals refer to like features in FIG. 4 and at a subsequent fabrication stage, the gaps 61, 63 in the SOI layer 14 between the gate electrode 60 and contact regions 62, 64, as well as other similar gaps in the SOI layer 14, are filled with portions of dielectric material to define shallow trench isolation (STI) regions 65, 66, 67, 68 that extend through the SOI layer 14 to directly contact the top surface 15 of the buried insulating layer 16. The dielectric material contained in the STI regions 65, 66, 67, 68 may comprise $SiO_2$, and can be formed using standard techniques. For example, the unfilled openings in the SOI layer 14 may be filled with amounts of dielectric material, such as an oxide like tetraethylorthosilicate (TEOS) deposited by a CVD process or a high density plasma (HDP) oxide, and planarized by a CMP process. Planarization removes extraneous dielectric material from the top surface 20 of the SOI layer 14 and leaves the dielectric material in STI regions 65, 66, 67, 68. STI region 66 filling the former gap 61 is disposed laterally between the gate electrode 60 and the contact region 62. STI region 67 filling the former gap 63 is disposed laterally between the gate electrode 60 and the contact region 64.

A contact 70 to doped region 38 is formed in contact region 62 of the SOI layer 14. A contact 72 to the doped region 40 is formed in the contact region 64 of the SOI layer 14. The contacts 70, 72, which extend completely through the SOI layer 14 and buried insulating layer 16, are composed of a material having a relatively high electrical conductivity in comparison to the semiconductor material constituting the SOI layer 14 and the dielectric material contained in the buried insulating layer 16. In various embodiments, the contacts 70, 72 may be composed of various different metals or metal alloys including, but not limited to, tungsten or a tungsten alloy.

The contacts 70, 72 may be formed by patterning the SOI layer 14 and buried insulating layer 16 using a conventional lithography and etching process to define respective trenches and then filling the trenches with respective masses of the conductor. The lithography process entails applying a resist (not shown) and a hardmask (not shown) on the top surface 20 of the SOI layer 14, exposing the resist to a pattern of radiation to create a latent pattern of the trenches in the resist for the contacts 70, 72, developing the latent pattern in the exposed resist, transferring the developed pattern to the hardmask with a dielectric etching process, and stripping the residual resist with plasma ashing or a chemical stripper. The pattern is transferred from the hardmask to the SOI layer 14 and buried insulating layer 16 by an anisotropic etching process, such as RIE, that may be conducted in a single etching step or in multiple etching steps with different etch chemistries. After etching is concluded, the hardmask is removed with a conventional wet chemical stripping process. The trenches for contacts 70, 72 extend in a vertical direction substantially transverse to a plane containing the top surface 20 of the SOI layer 14. The contacts 70, 72 are then formed by filling the trenches with conductor masses by depositing a blanket layer of a suitable conductor and planarizing to the top surface 20 of the SOI layer 14 using, for example, a CMP process.

A device structure, which is generally indicated by reference numeral 74, results that may either have a p-channel construction or an n-channel construction characteristic of a field effect transistor. The specific construction is contingent upon the doping of the semiconductor material during processing. The device structure 74 includes the doped regions 38, 40 in the handle substrate 12, which operates as source and drain regions of the device structure 74, and the channel region 75 that is disposed between the doped regions 38, 40. The channel region 75 defined in the handle substrate 12 has an opposite conductivity type in comparison with the doped regions 38, 40. The channel region 75 physically separates the source region defined by doped region 38 from the drain region defined by doped region 40. Hence, the source, drain, and channel regions of the device structure 74 have a lateral arrangement within the handle substrate 12.

The gate electrode 60 is located directly above the channel region 75 and is generally aligned with the channel region 75, but is physically separated from the channel region 75 by the intervening thickness of the dielectric material in the buried insulating layer 16. Applying an appropriate gate voltage to the gate electrode 60 switches the device structure 74 on, enabling current to flow through the channel region 75 between doped regions 38, 40. Removing the gate voltage from the gate electrode 60 switches off the device structure 74 and halts current flows through the channel region 75 between the doped regions 38, 40. Fabricating the gate electrode 60 from a portion of the SOI layer 14 eliminates the need to fabricate a conventional gate electrode and, as a result, simplifies the fabricate process by eliminating a mask otherwise required in conventional CMOS processes.

In one embodiment in which the device structure 74 is an n-channel field effect transistor, the semiconductor material of the doped regions 38, 40 in the handle substrate 12 contain a moderate concentration of an n-type impurity species, and the semiconductor material of the channel region 75 in the handle substrate 12 may be doped with a concentration of a p-type impurity species. Alternatively, the fabrication process forming the device structure 74 may be modified to provide an p-channel field effect transistor by oppositely doping the doped regions 38, 40 with a p-type dopant and the channel region 75 with a concentration of an n-type impurity species as understood by a person having ordinary skill in the art.

The conductive studs 46, 48 and insulating liners 42, 44 in deep trenches 22, 24 operate to reduce transient device currents during switching and, thereby, improves the transient response of the device structure 74. The conductor forming the conductive studs 46, 48 has a capacitance that provides the reduction in transient device currents.

During the fabrication process, the device structure 74 is replicated across at least a portion of the surface area of the SOI layer 14 of the SOI wafer 10. Standard processing follows, which includes formation of metallic contacts and metallization for the M1-level local interconnect wiring, and formation of dielectric layers, conductive vias, and metallization for upper level (M2-level, M3-level, etc.) interconnect wiring coupled with the contacts 70, 72 and other similar contacts for additional device structures like device structure 74 and other circuitry on the SOI wafer 10. In the M1-level, an additional contact (not shown) is provided to the gate electrode 60.

Figure 6:
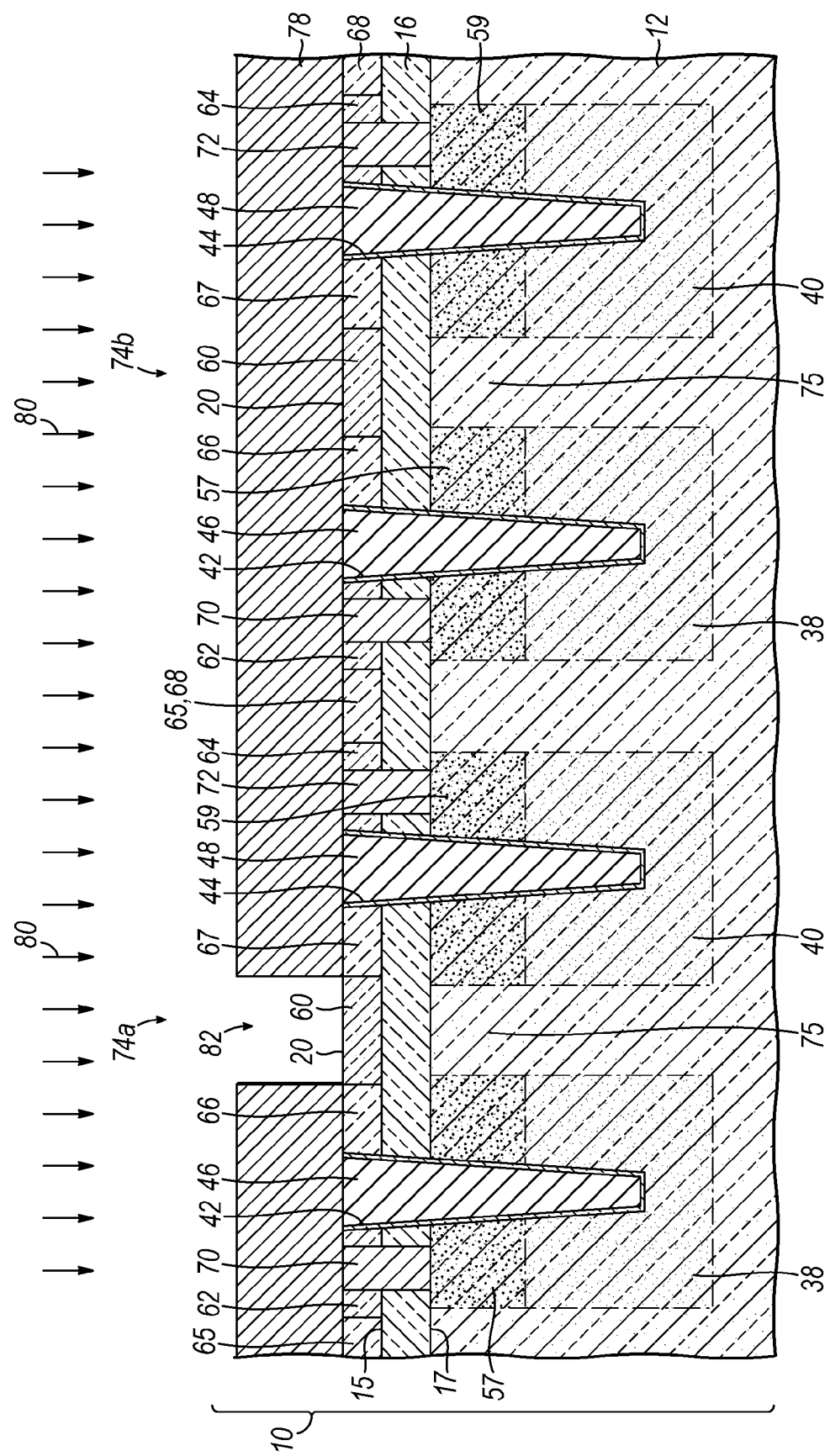
FIGS. 6 and 7 are diagrammatic cross-sectional views of a portion of a substrate at successive fabrication stages of a processing method for fabricating a device structure in accordance with an alternative embodiment of the invention.

With reference to FIG. 6 in which like reference numerals refer to like features in FIG. 5 and at a fabrication stage subsequent to FIG. 5 in accordance with an alternative embodiment, a pair of device structures 74a, 74b are structured identically to device structure 74. Specifically, each of the devices structures 74a, 74b has doped regions 38, 40 that are p-type and a channel region 75 of p-type semiconductor material from handle substrate 12. An implantation mask 78, which is similar to implantation mask 50 (FIG. 3) is applied to the top surface 20 of the SOI layer 14 and the top surface of the studs 46, 48. The implantation mask 78 is patterned to define a window 82 that is aligned with the gate electrode 60 of device structure 74a.

The gate electrode 60 of device structure 74a is then implanted through window 82 with p-type dopant ions 80. The gate electrode 60 of the adjacent device structure 74b, however, is masked by the implantation mask 78. The kinetic energy of the ions 80 implanted into the gate electrode 60 of device structure 74a is selected such that the projected range of the ions 80 is within the gate electrode 60 of device structure 74a and the ions 80 primarily stop within the gate electrode 60. The kinetic energy is also selected in conjunction with the layer thickness of the implantation mask 78 so that the ions 80 do not penetrate through the implantation mask 78. As a result, the gate electrode 60 of device structure 74a receives a dose of the implanted p-type dopant ions 80 and the gate electrode 60 of device structure 74b is not doped by the ions 80. The dopant introduced by the ions 80 constitutes the dominant or majority dopant in the gate electrode 60 of device structure 74a. Following implantation, the implantation mask 78 is removed by ashing or solvent stripping.

Figure 7:
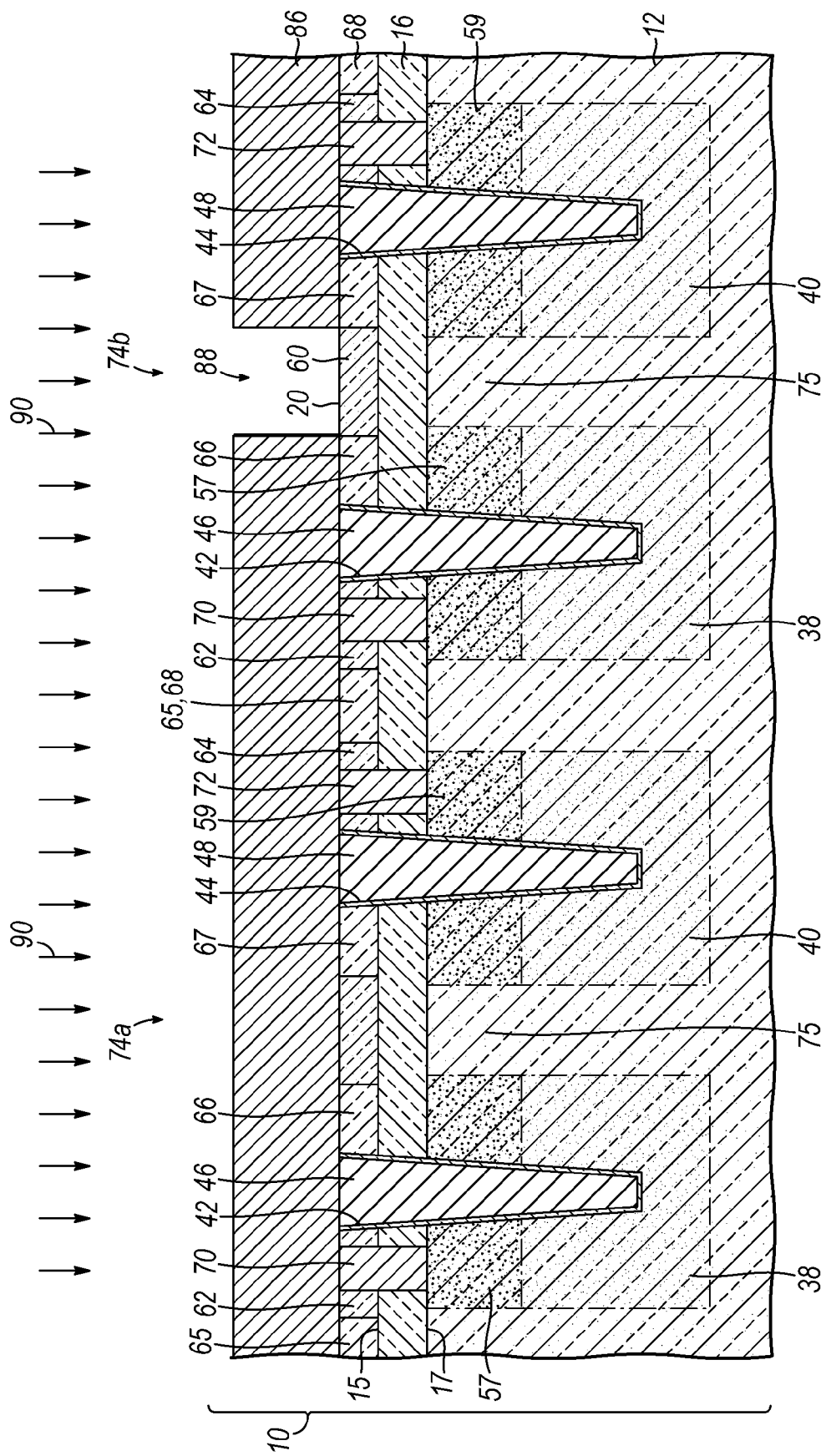

With reference to FIG. 7 in which like reference numerals refer to like features in FIG. 6 and at a subsequent fabrication stage, an implantation mask 86, which is similar to implantation mask 50 (FIG. 3) is applied to the top surface 20 of the SOI layer 14 and the top surface of the studs 46, 48 and patterned to define a window 88 aligned with the gate electrode 60 of device structure 74b. The gate electrode 60 of the adjacent device structure 74a is masked by the implantation mask 78 and the gate electrode 60 of the adjacent device structure 74b is exposed by window 88.

The gate electrode 60 of device structure 74b is implanted with n-type dopant ions 90. The kinetic energy of the ions 90 is selected such that the projected range of the ions 90 is within the gate electrode 60 of device structure 74b and the ions 90 primarily stop within the gate electrode 60 of device structure 74b. The kinetic energy is also selected in conjunction with the layer thickness of the implantation mask 86 so that the ions 90 do not penetrate through the implantation mask 86. As a result, the gate electrode 60 of device structure 74b receives a dose of the implanted n-type dopant ions 90 and the gate electrode 60 of device structure 74a, which was previously doped with p-type dopant ions 80 (FIG. 6), is not further doped. The dopant introduced by the ions 90 constitutes the dominant or majority dopant in the gate electrode 60 of device structure 74b. Following implantation, the implantation mask 86 is removed by ashing or solvent stripping.

The complementary differential doping of the gate electrodes 60 of device structures 74a,b, which is provided by the fabrication stages of FIGS. 6 and 7, may beneficial for use in producing a band-gap regulator needed in many circuits as a voltage regulator. This may eliminate the conventional need for high process control to fabricate precisely matched diodes of high ideality for use in voltage regulators. The device structures 74a,b differ only in the doping of the respective gate electrodes 60. The threshold voltage for the device structures 74a,b is identical but for the difference in the gate doping. The numerical difference in the threshold voltage between device structures 74a,b from the differential gate doping is about 1.1 eV. The voltage difference is independent of other process variations as the device structures 74a,b share the prior fabrication stages (FIGS. 1-5). Specifically, the doped regions 38, 40 comprising the source and drain regions of the device structure 74a has approximately equal doping in comparison with the doped regions 38, 40 comprising the source and drain regions of the device structure 74b. In addition, the gate electrode 60 of device structure 74a has approximately equal dimensions to the gate electrode 60 of device structure 74b. The device structures 74a,b may be useful in providing a voltage reference because of the difference in the threshold voltage.

In alternative embodiments, the final device structure 74 may incorporate a different type of gate electrode than the gate electrode 60, as described below.

Figure 8:
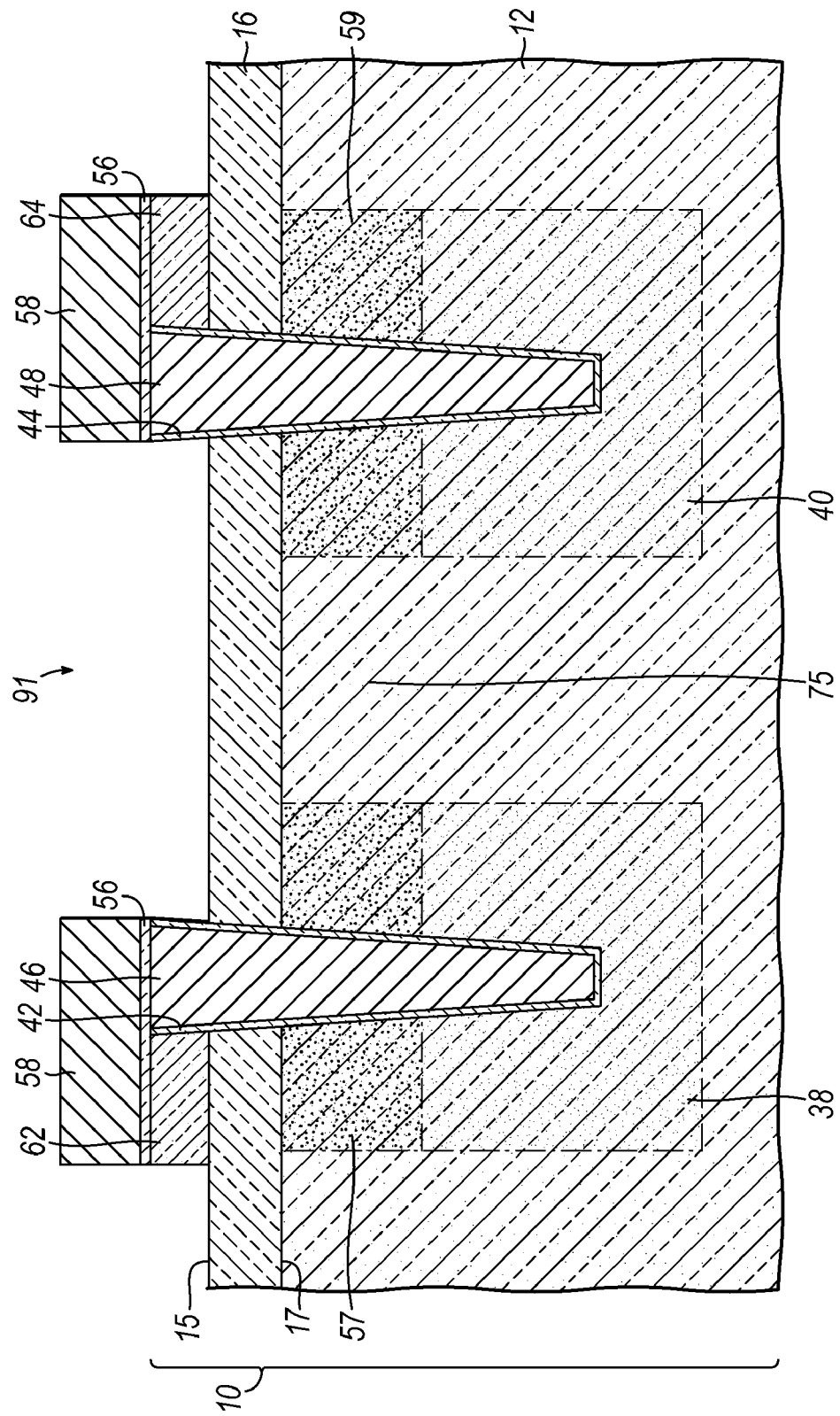
FIGS. 8-10 are diagrammatic cross-sectional views of a portion of a substrate at successive fabrication stages of a processing method for fabricating a device structure in accordance with an alternative embodiment of the invention.

With reference to FIG. 8 in which like reference numerals refer to like features in FIG. 4 and in accordance with an alternative embodiment of the invention, the hardmask layer 56 is used to pattern the SOI layer 14 using a standard photolithography and subtractive etching process, but lacks an opening to form the gate electrode 60 (FIG. 4). As a result, only the contact regions 62, 64 are defined as residual regions of the SOI layer 14 underlying the masked surface areas of SOI layer 14. A single gap 91 is defined between the contact regions 62, 64.

Figure 9:
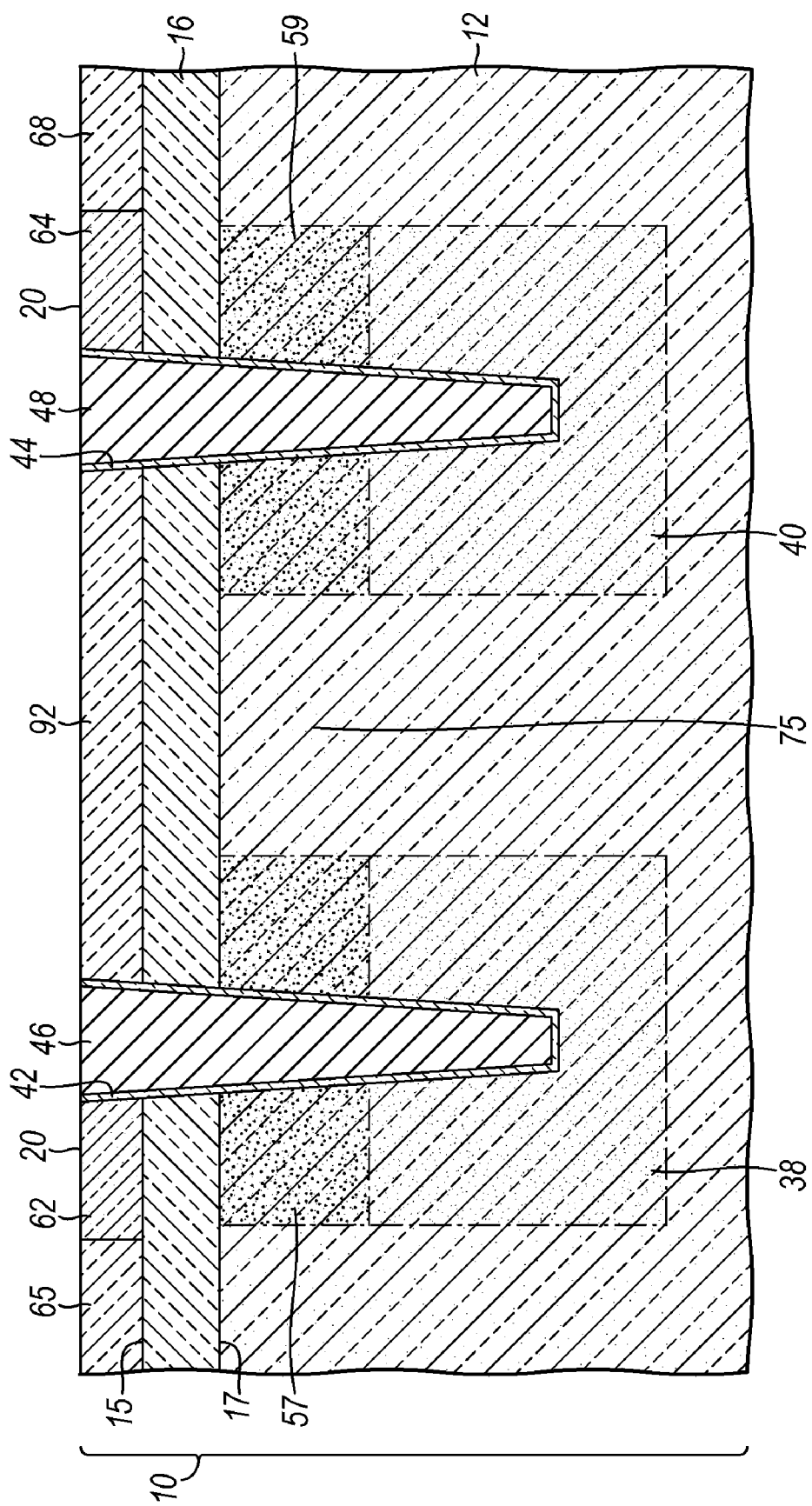

With reference to FIG. 9 in which like reference numerals refer to like features in FIG. 8 and at a subsequent fabrication stage, the gap 91 in the SOI layer 14, as well as other similar gaps in the SOI layer 14, are filled with portions of dielectric material to define a STI region 92, as well as to define STI regions 65 and 68, that extend through the SOI layer 14 to directly contact the top surface 15 of the buried insulating layer 16. The STI regions 65, 68, 92 are formed as described previously in connection with the description of FIG. 5. STI region 92 is disposed laterally between the contact regions 62, 64. Contacts 70, 72 to the doped regions 38, 40 are formed by patterning the SOI layer 14 and buried insulating layer 16, as also described previously in connection with the description of FIG. 5.

Figure 10:
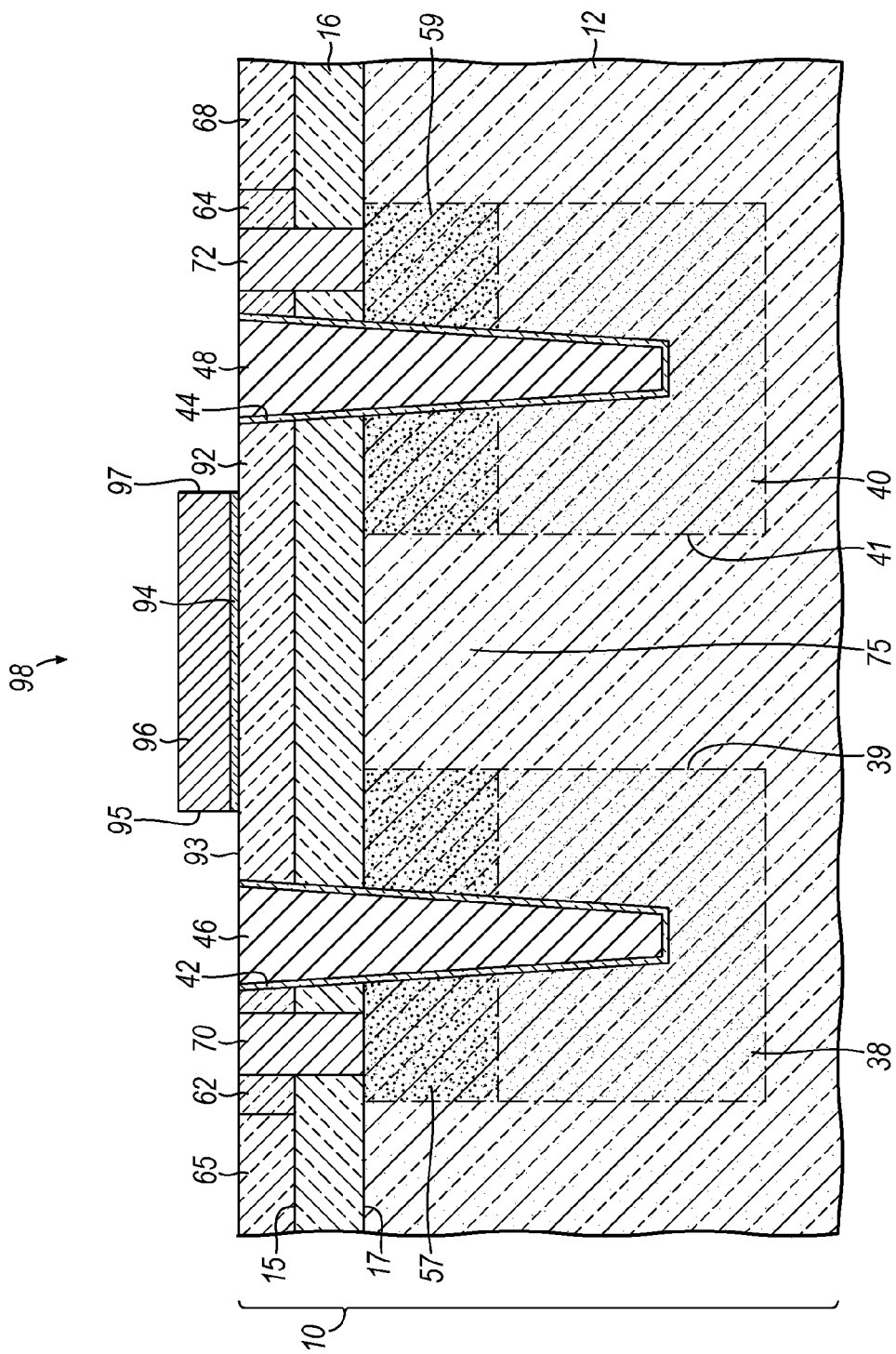

With reference to FIG. 10 in which like reference numerals refer to like features in FIG. 9 and at a subsequent fabrication stage, a gate stack is formed that includes a gate dielectric layer 94 in direct contact with a top surface 93 of the STI region 92 and a gate electrode 96 separated from the top surface 20 by the gate dielectric layer 94. The gate electrode 96, which is considerably thicker than the gate dielectric layer 94, is formed directly on the dielectric material of the STI region 92. In the representative embodiment, gate electrode 96 has a sidewall 95 that is approximately registered or aligned with the perimeter 39 of the doped region 38 and another sidewall 97 that is approximately registered or aligned with the perimeter 41 of the doped region 40. In the resulting device structure 98, the gate electrode 96 is located directly above the channel region 75 but is physically separated from the channel region 75 by the intervening thickness of dielectric material in the buried insulating layer 16, the STI region 92, and the gate dielectric layer 94. The registration of sidewalls 95, 97 with the perimeters 39, 41 may vary so long as the gate electrode 96 is aligned or registered with a channel region 75 in the semiconductor material of the handle substrate 12 in a manner that permits a control voltage to regulate the charge carrier current in the channel region 75.

Applying an appropriate gate voltage to the gate electrode 96 switches the device structure 98 on, enabling current to flow through the channel region 75 between doped regions 38, 40. Removing the gate voltage from the gate electrode 96 switches off the device structure 98 and halts current flows through the channel region 75 between the doped regions 38, 40.

Candidate dielectric materials for the gate dielectric layer 94 include, but are not limited to, $SiO_xN_y$, a hafnium-based high-k dielectric material like $HfO_2$ or $HfSiO_4$, and layered stacks of these materials. The gate electrode 96 is composed of a conductor characterized by a significantly higher electrical conductivity than the dielectric material in the gate dielectric layer 94. In representative embodiments, the conductor constituting the gate electrode 96 may be composed of a metal, doped polysilicon, a metal silicide, or a combination of these conductive materials. The gate dielectric layer 94 and gate electrode 96 are fashioned from a stacked dielectric and conductor layers by a conventional photolithography and etching process. Sidewall spacers (not shown) composed of a dielectric material, such as $Si_3N_4$, may be formed on the sidewalls of the gate electrode 96 by a known spacer formation process.

During the fabrication process, the device structure 98 is replicated across at least a portion of the surface area of the SOI layer 14 of the SOI wafer 10. Standard processing follows, which includes formation of metallic contacts, metallization for the M1-level local interconnect wiring, and interlayer dielectric layers, conductive vias, and metallization for upper level (M2-level, M3-level, etc.) interconnect wiring coupled with the contacts 70, 72 and other similar contacts for additional device structures like device structure 74 and other circuitry on the SOI wafer 10. In the M1-level, an additional contact (not shown) is provided to the gate electrode 96.

Figure 11:
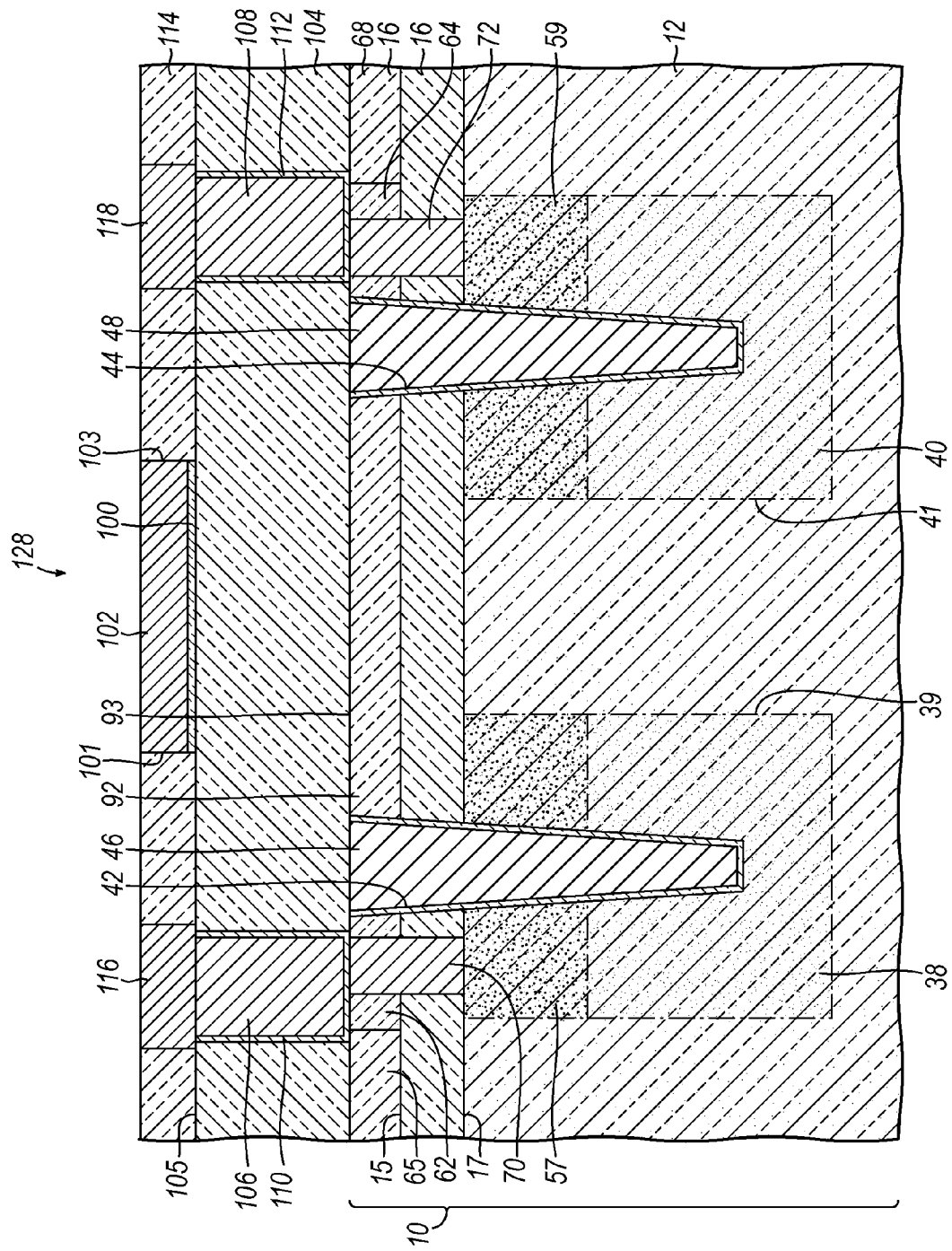
FIG. 11 is a diagrammatic cross-sectional view of a portion of a substrate at a fabrication stage of a processing method for fabricating a device structure in accordance with an alternative embodiment of the invention.

With reference to FIG. 11 in which like reference numerals refer to like features in FIG. 9 and in accordance with an alternative embodiment of the invention, a gate dielectric layer 100 and a gate electrode 102 are formed as structures in one of the interconnect levels, such as the M1-level. The gate dielectric layer 100 and gate electrode 102 may be respectively identical in construction to the gate dielectric layer 94 and gate electrode 96 (FIG. 10). An interlayer dielectric 104 is formed in direct contact with the STI regions 65, 68, 92, conductive studs 46, 48, contact regions 62, 64, and contacts 70, 72. Plugs 106, 108 and liners 110, 112 respectively separating the plugs 106, 108 from the dielectric material of the interlayer dielectric 104 are defined in respective vias that land on the contacts 70, 72. An intralayer dielectric 114 is formed on a top surface 105 of the interlayer dielectric 104. Wires 116, 118 are defined in respective trenches that land on the plugs 106, 108. As a result, the plugs 106, 108 electrically connect the contacts 70, 72 with the wires 116, 118.

The interlayer dielectric 104 and intralayer dielectric 114 may be composed of any organic or inorganic electrically-insulating material recognized by a person having ordinary skill in the art, which may be deposited by any of number of well known conventional techniques such as sputtering, spin-on application, a CVD process, or a plasma enhanced CVD (PECVD) process. Representative inorganic dielectric materials for interlayer dielectric 104 and intralayer dielectric 114 include, but are not limited to, silicon dioxide, fluorine-doped silicon glass (FSG), carbon doped oxide, fluorinated silicon oxide, and combinations of these dielectric materials. The constituent dielectric material of interlayer dielectric 104 may be characterized by a relative permittivity or dielectric constant smaller than about 3.0. Representative low-k dielectric materials for interlayer dielectric 104 and intralayer dielectric 114 include, but are not limited to, porous and nonporous spin-on organic low-k dielectrics, such as spin-on aromatic thermoset polymer resins like polyimides and fluorinated polyimides and vapor-phase deposited polymer resins like parylene, porous and nonporous inorganic low-k dielectrics, such as organosilicate glasses, siloxanes, silsesquioxanes, hydrogen-enriched silicon oxycarbide (SiCOH), amorphous carbon and fluorinated carbon films, and carbon-doped oxides, and combinations of organic and inorganic dielectrics in a layered structure. Such low-k materials may operate to reduce the capacitance of the completed interconnect structure as understood by a person having ordinary skill in the art.

The liners 110, 112 may be composed of one or more layers of conductors selected from, but not limited to, titanium (Ti), tantalum (Ta), nickel (Ni), tungsten (W), iridium (Jr), platinum (Pt), cobalt (Co), niobium (Nb), ruthenium (Ru), and like metals, stoichiometric or non-stoichiometric nitrides of these metals, such as titanium nitride (TiN) and tantalum nitride (TaN), alloys of these metals, such as a titanium-niobium alloy, a tantalum-tungsten alloy, a tantalum-iridium alloy, or a titanium-zirconium alloy, alloys of these metals, such as an alloy of titanium and tungsten, a titanium/titanium nitride bilayer, a tantalum/tantalum nitride bilayer and other like materials including combinations thereof. The conductors constituting the liners 110, 112 may be applied utilizing a conventional deposition process such as a CVD process, a PECVD process, PVD, ALD, plating, or chemical solution deposition.

The plugs 106, 108 and wires 116, 118 may be composed of any suitable conductive material including, but not limited to, copper (Cu), aluminum (Al), gold (Au), molybdenum (Mo), Ta, Ti, or W, alloys of these metals, doped polysilicon, silicides, and other similar metals, deposited by conventional deposition processes including, but not limited to, evaporation, sputtering, or a CVD process and an electrochemical process like electroplating or electroless plating. Excess conductive material is removed by a planarization process, such as a CMP process. A thin layer of a seed material (not shown) may be provided to promote deposition of the conductive material forming the plugs 106, 108 and wires 116, 118 and, for example, may provide a nucleation site for an electroless plating process.

In the resulting device structure 128, the gate electrode 102 is located directly above the channel region 75 but is physically separated from the channel region 75 by the intervening region of the buried insulating layer 16, the STI region 92, the interlayer dielectric 104, and the gate dielectric layer 100. This arrangement positions the gate electrode 102 indirectly on the STI region 92. Gate electrode 102 has a sidewall 101 that is approximately registered or aligned with the perimeter 39 of the doped region 38 and another sidewall 103 that is approximately registered or aligned with the perimeter 41 of the doped region 40. The registration of sidewalls 101, 103 with the perimeters 39, 41 may vary so long as the gate electrode 102 is aligned or registered with a channel region 75 in the semiconductor material of the handle substrate 12 to an extent that permits a control voltage to regulate the charge carrier current in the channel region 75. Applying an appropriate gate voltage to the gate electrode 102 switches the device structure 128 on, enabling current to flow through the channel region 75 between doped regions 38, 40. Removing the gate voltage from the gate electrode 102 switches off the device structure 128 and halts current flows through the channel region 75 between the doped regions 38, 40.

Figure 12:
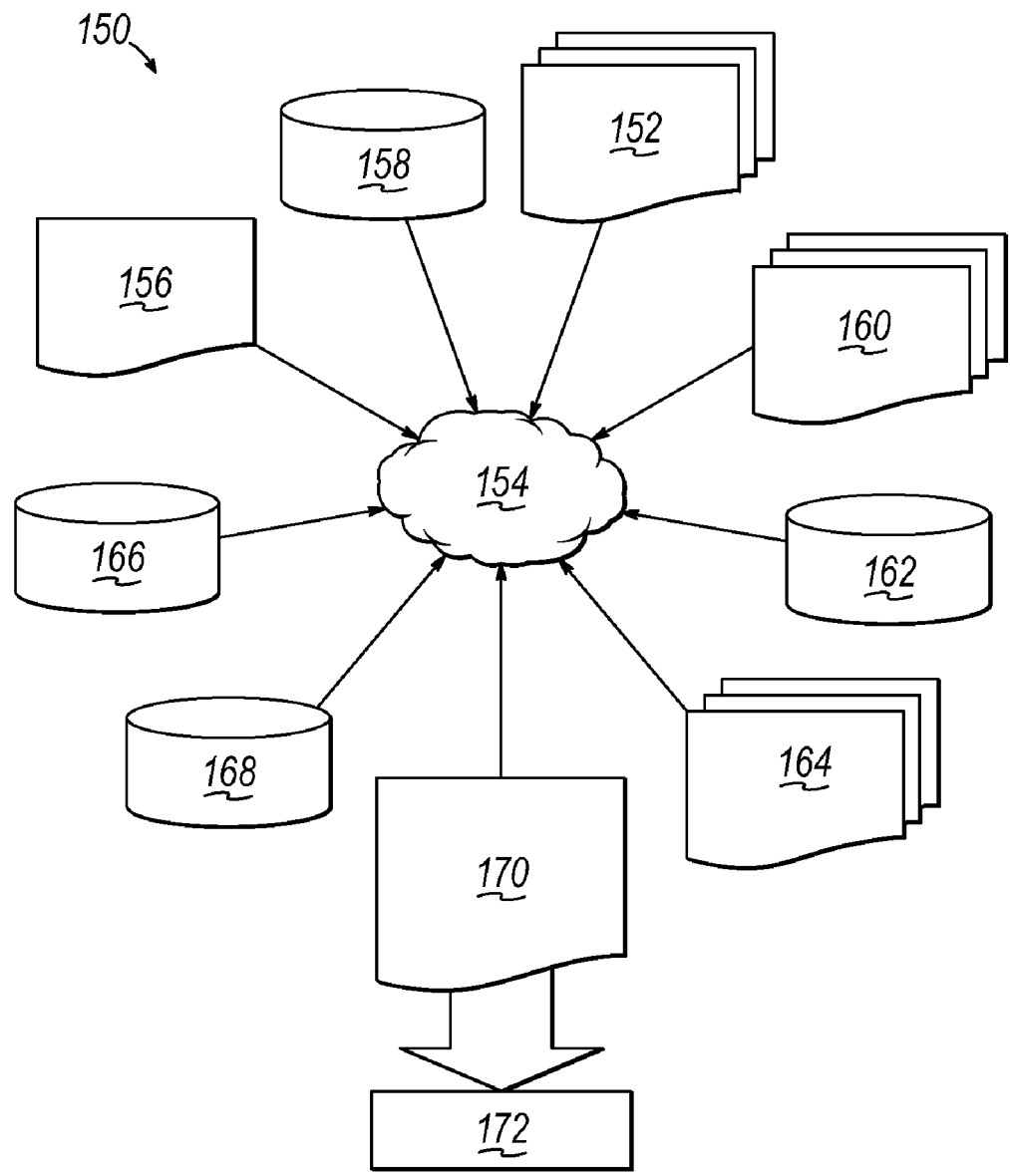
FIG. 12 is a flow diagram of a design process used in semiconductor design, manufacture, and/or test.

FIG. 12 shows a block diagram of an exemplary design flow 150 used for example, in semiconductor IC logic design, simulation, test, layout, and manufacture. Design flow 150 includes processes, machines and/or mechanisms for processing design structures or devices to generate logically or otherwise functionally equivalent representations of the design structures and/or devices described above and shown in FIGS. 5, 7, 10, 11. The design structures processed and/or generated by design flow 150 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g. a machine for programming a programmable gate array).

Design flow 150 may vary depending on the type of representation being designed. For example, a design flow 150 for building an application specific IC (ASIC) may differ from a design flow 150 for designing a standard component or from a design flow 150 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 152 that is preferably processed by a design process 154. Design structure 152 may be a logical simulation design structure generated and processed by design process 154 to produce a logically equivalent functional representation of a hardware device. Design structure 152 may also or alternatively comprise data and/or program instructions that when processed by design process 154, generate a functional representation of the physical structure of a hardware device. Whether representing functional and/or structural design features, design structure 152 may be generated using electronic computer-aided design (ECAD) such as implemented by a core developer/designer. When encoded on a machine-readable data transmission, gate array, or storage medium, design structure 152 may be accessed and processed by one or more hardware and/or software modules within design process 154 to simulate or otherwise functionally represent an electronic component, circuit, electronic or logic module, apparatus, device, or system such as those shown in FIGS. 5, 7, 10, 11. As such, design structure 152 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 154 preferably employs and incorporates hardware and/or software modules for synthesizing, translating, or otherwise processing a design/simulation functional equivalent of the components, circuits, devices, or logic structures shown in FIGS. 5, 7, 10, 11 to generate a netlist 156 which may contain design structures such as design structure 152. Netlist 156 may comprise, for example, compiled or otherwise processed data structures representing a list of wires, discrete components, logic gates, control circuits, I/O devices, models, etc. that describes the connections to other elements and circuits in an integrated circuit design. Netlist 156 may be synthesized using an iterative process in which netlist 156 is resynthesized one or more times depending on design specifications and parameters for the device. As with other design structure types described herein, netlist 156 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 154 may include hardware and software modules for processing a variety of input data structure types including netlist 156. Such data structure types may reside, for example, within library elements 158 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 160, characterization data 162, verification data 164, design rules 166, and test data files 168 which may include input test patterns, output test results, and other testing information. Design process 154 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 154 without deviating from the scope and spirit of the invention. Design process 154 may also include modules for performing standard circuit design processes such as timing analysis, verification, design rule checking, place and route operations, etc.

Design process 154 employs and incorporates logic and physical design tools such as HDL compilers and simulation model build tools to process design structure 152 together with some or all of the depicted supporting data structures along with any additional mechanical design or data (if applicable), to generate a second design structure 170. Design structure 170 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 152, design structure 170 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 5, 7, 10, 11. In one embodiment, design structure 170 may comprise a compiled, executable HDL simulation model that functionally simulates the devices shown in FIGS. 5, 7, 10, 11.

Design structure 170 may also employ a data format used for the exchange of layout data of integrated circuits and/or symbolic data format (e.g. information stored in a GDSII (GDS2), GL1, OASIS, map files, or any other suitable format for storing such design data structures). Design structure 170 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 5, 7, 10, 11. Design structure 170 may then proceed to a stage 172 where, for example, design structure 170: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Furthermore, to the extent that the terms "includes", "having", "has", "with", or variants thereof are used in either the detailed description or the claims, such terms are intended to be inclusive in a manner similar to the term "comprising."

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of fabricating a device structure using a layer stack that includes a semiconductor layer, a handle substrate composed of a semiconductor material of a first conductivity type, and an insulating layer between the semiconductor layer and the handle substrate, the method comprising:
    forming a first trench and a second trench each extending from a top surface of the semiconductor layer through the semiconductor layer and the insulating layer into the handle substrate;
    at least partially filling the first trench and the second trench with a doped material containing a dopant having a second conductivity type in the semiconductor material that is opposite to the first conductivity type;
    transporting a concentration of the dopant outwardly from the doped material into the semiconductor material of the handle substrate surrounding the first trench to define a first doped region of the second conductivity type and into the semiconductor material of the handle substrate surrounding the second trench to define a second doped region of the second conductivity type; and
    forming a gate electrode aligned with a channel region defined in the semiconductor material of the handle substrate between the first and second doped regions.

2. The method of claim 1 further comprising:
    forming a first contact extending from the top surface through the semiconductor layer and the insulating layer to the first doped region; and forming a second contact extending from the top surface through the semiconductor layer and the insulating layer to the second doped region.

3. The method of claim 1 further comprising:
removing the doped material from the first and second trenches after the first and second doped regions are defined.

4. The method of claim 3 further comprising:
lining the first trench with a first dielectric liner;
lining the second trench with a second dielectric liner;
forming a first conductive stud in the first trench that is separated from the handle substrate, the insulating layer, and the semiconductor layer by the first dielectric liner; and
forming a second conductive stud in the second trench that is separated from the handle substrate, the insulating layer, and the semiconductor layer by the second dielectric liner.

5. The method of claim 1 further comprising:
before the gate electrode is formed, applying an implantation mask with openings coincident with the first and second doped regions; and
implanting ions having the second conductivity type into the first and second doped regions.

6. The method of claim 1 wherein forming the gate electrode above the channel region defined in the handle substrate between the first and second doped regions further comprises:
applying an etch mask on the semiconductor layer; and
etching the semiconductor layer to define the gate electrode from a portion of the semiconductor layer.

7. The method of claim 1 further comprising:
forming a shallow trench isolation region composed of a dielectric material and located in the semiconductor layer at a location aligned with the channel in the handle substrate.

8. The method of claim 7 wherein forming the gate electrode above the channel region defined in the handle substrate between the first and second doped regions further comprises:
forming the gate electrode on the shallow trench isolation region.

9. The method of claim 7 further comprising:
forming a dielectric layer on the shallow trench isolation region; and
forming a conductive feature in the dielectric layer.

10. The method of claim 9 wherein forming the gate electrode above the channel region defined in the handle substrate between the first and second doped regions further comprises:
forming the gate electrode on the dielectric layer in alignment with the shallow trench isolation region and the channel region in the handle substrate.

11. The method of claim 1 wherein transporting the concentration of the dopant outwardly from the doped material into the handle substrate surrounding the first trench to define the first doped region of the second conductivity type and into the handle substrate surrounding the second trench to define the second doped region of the second conductivity type further comprises:
heating the semiconductor substrate and the doped material to an elevated temperature sufficient to thermally diffuse the dopant into the semiconductor material of the handle substrate surrounding the first and second trenches.

* * * * *